(12) United States Patent
Li et al.

(10) Patent No.: US 9,373,412 B2
(45) Date of Patent: *Jun. 21, 2016

(54) SYSTEM AND METHOD OF PROGRAMMING A MEMORY CELL

(71) Applicant: QUALCOMM Incorporated, San Diego, CA (US)

(72) Inventors: Xia Li, San Diego, CA (US); Bin Yang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/570,577

(22) Filed: Dec. 15, 2014

(65) Prior Publication Data

US 2015/0098270 A1 Apr. 9, 2015

Related U.S. Application Data

(63) Continuation of application No. 13/759,344, filed on Feb. 5, 2013, now Pat. No. 8,942,034.

(51) Int. Cl.
*G11C 5/14* (2006.01)
*G11C 16/30* (2006.01)
(Continued)

(52) U.S. Cl.
CPC ............ *G11C 17/18* (2013.01); *G06F 17/5045* (2013.01); *G11C 7/12* (2013.01);
(Continued)

(58) Field of Classification Search
CPC ........... G11C 5/146; G11C 2211/4016; G11C 11/404; G11C 16/04; G11C 5/06
USPC ............. 365/182, 185.27, 185.18, 185.05, 63
See application file for complete search history.

(56) References Cited

U.S. PATENT DOCUMENTS 6,667,902 B2 12/2003 Peng
8,203,861 B2 6/2012 Liu et al.
(Continued)

FOREIGN PATENT DOCUMENTS

CN 102376719 A 3/2012
JP 2001102456 A 4/2001
(Continued)

OTHER PUBLICATIONS

International Search Report and Written Opinion for International Application No. PCT/US2014/014132, ISA/EPO, Date of Mailing Apr. 25, 2014, 9 pages.
(Continued)

*Primary Examiner* — Ly D Pham
(74) *Attorney, Agent, or Firm* — Toler Law Group, PC

(57) ABSTRACT

An apparatus includes a semiconductor transistor structure. The semiconductor transistor structure includes dielectric material, a channel region, a gate, a source overlap region, and a drain overlap region. The source overlap region is biasable to cause a first voltage difference between the source overlap region and the gate to exceed a breakdown voltage of the dielectric material. The drain overlap region is biasable to cause a second voltage difference between the drain overlap region and the gate to exceed the breakdown voltage. The apparatus includes a well line coupled to a body of the semiconductor transistor. The apparatus includes circuitry configured to apply a voltage to the well line to prevent a breakdown condition between the channel region and the gate.

20 Claims, 8 Drawing Sheets

(51) Int. Cl.

| | | |
|---|---|---|
| *G11C 16/04* | (2006.01) | |
| *G11C 5/06* | (2006.01) | |
| *G11C 17/18* | (2006.01) | |
| *G11C 7/12* | (2006.01) | |
| *G06F 17/50* | (2006.01) | |
| *G11C 11/40* | (2006.01) | |
| *G11C 17/16* | (2006.01) | |
| *G11C 11/404* | (2006.01) | |

(52) U.S. Cl.
CPC .............. *G11C 11/40* (2013.01); *G11C 17/16* (2013.01); *G11C 5/06* (2013.01); *G11C 5/146* (2013.01); *G11C 11/404* (2013.01); *G11C 16/04* (2013.01); *G11C 2211/4016* (2013.01)

(56) References Cited

U.S. PATENT DOCUMENTS

| | | |
|---|---|---|
| 8,305,805 B2 | 11/2012 | Liu et al. |
| 2004/0047218 A1 | 3/2004 | Peng |
| 2006/0038255 A1 | 2/2006 | Kushida |
| 2006/0054952 A1 | 3/2006 | Schoellkopf et al. |
| 2010/0110750 A1 | 5/2010 | Namekawa |
| 2010/0237463 A1 | 9/2010 | Kang et al. |
| 2012/0008364 A1 | 1/2012 | Lai et al. |
| 2012/0014200 A1 | 1/2012 | Buer |
| 2012/0287715 A1 | 11/2012 | Liu |
| 2014/0219016 A1 | 8/2014 | Li et al. |

FOREIGN PATENT DOCUMENTS

| | | |
|---|---|---|
| JP | 2005504434 A | 2/2005 |
| JP | 2006059919 A | 3/2006 |
| JP | 2010113746 A | 5/2010 |
| JP | 2012043970 A | 3/2012 |
| TW | 200623137 A | 7/2006 |
| WO | 2010107772 | 9/2010 |

OTHER PUBLICATIONS

Kulkarni, S.H., et al., "A 32nm High-k and Metal-Gate Anti-Fuse Array Featuring a 1.01μm2 1T1C Bit Cell," Symposium on VLSI Technology Digest of Technical Papers, 2012, IEEE, Piscataway, NJ, pp. 79-80.

Taiwan Search Report for Taiwan Application No. TW103103647, TIPO, Date of Completion of Search Jun. 3, 2015, 1 page.

SYSTEM AND METHOD OF PROGRAMMING A MEMORY CELL

I. CLAIM OF PRIORITY

This application claims priority from and is a continuation of U.S. patent application Ser. No. 13/759,344 filed on Feb. 5, 2013, and entitled "SYSTEM AND METHOD OF PROGRAMMING A MEMORY CELL," the contents of which are incorporated herein in their entirety.

II. FIELD

The present disclosure is generally related to programming a memory cell.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The circuitry within wireless telephones and other electronic devices may use a one-time-programmable (OTP) device to program and store a data value. An OTP device may program a data value by creating a gate oxide breakdown at a source, drain, and/or channel region of a transistor within the device, such as a complementary metal oxide semiconductor (CMOS) transistor. A gate oxide breakdown enables current flow between the transistor's gate and the transistor's source/drain region and the transistor's channel region when a read voltage is applied, while a non-programmable device will exhibit substantially zero gate to source/drain current. However, usage of an OTP device may consume large amounts of die area.

Further, variations in the gate oxide breakdown location with respect to the source, drain, and channel region may affect an amount of resistance following oxide breakdown. For example, an oxide breakdown at the channel region may cause a large bipolar resistance, while an oxide breakdown at either the source region or the drain region may cause a smaller linear resistance.

After the oxide breakdown, a read voltage may be applied to the transistor to detect a read current for a dielectric breakdown. However, when a read voltage is applied to the OTP device to read the stored data value after the gate oxide breakdown, the source and drain regions of the transistor may be over-stressed if the read voltage corresponds to a read voltage for a breakdown in the channel region (i.e., a large read voltage to compensate for the larger resistance). Over-stressing the source and drain regions of the transistor may cause reliability failure at the OTP device.

IV. SUMMARY

Systems and methods to program a memory cell are disclosed. A two-time-programmable (TTP) device includes a programmable transistor. The programmable transistor may be programmed by creating a first conductivity path (i.e., a gate-oxide breakdown) between a gate of the programmable transistor and a source of the programmable transistor and creating a second conductivity path between the gate and a drain of the programmable transistor. For example, a voltage difference between the gate and the source may exceed a breakdown voltage, thus creating the conductivity path between the gate and the source. Likewise, a voltage difference between the gate and the drain may exceed the breakdown voltage, thus creating the second conductivity path between the gate and the drain. To create the conductivity paths, a gate voltage, a source voltage, and a drain voltage may be applied to the gate, the source, and the drain, respectively. A breakdown is prevented from occurring at a channel region of the programmable transistor by applying a voltage to a well of the transistor that causes the voltage difference between the gate and a channel to be less than a dielectric breakdown voltage. During TTP device programming and read operation, the programmable transistor is setup in an "off" state (e.g., zero or approximately zero current flow between the source and the drain).

In a particular embodiment, a method includes selectively creating a first breakdown condition and a second breakdown condition at a semiconductor transistor structure. The first breakdown condition is between a source overlap region of the semiconductor transistor structure and a gate of the semiconductor transistor structure. The second breakdown condition is between a drain overlap region of the semiconductor transistor structure and the gate.

In another particular embodiment, an apparatus includes a semiconductor transistor structure that includes a source overlap region and a drain overlap region. The source overlap region is selectively biasable to create a first breakdown condition between the source overlap region and a gate of the semiconductor transistor structure. The drain overlap region is selectively biasable to create a second breakdown condition between the drain overlap region and the gate.

One particular advantage provided by at least one of the disclosed embodiments is an ability to reduce die area by permitting two logical states per cell, as opposed to having two cells with one logical state per cell as for one-time-programmable (OTP) devices. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

Figure 7:
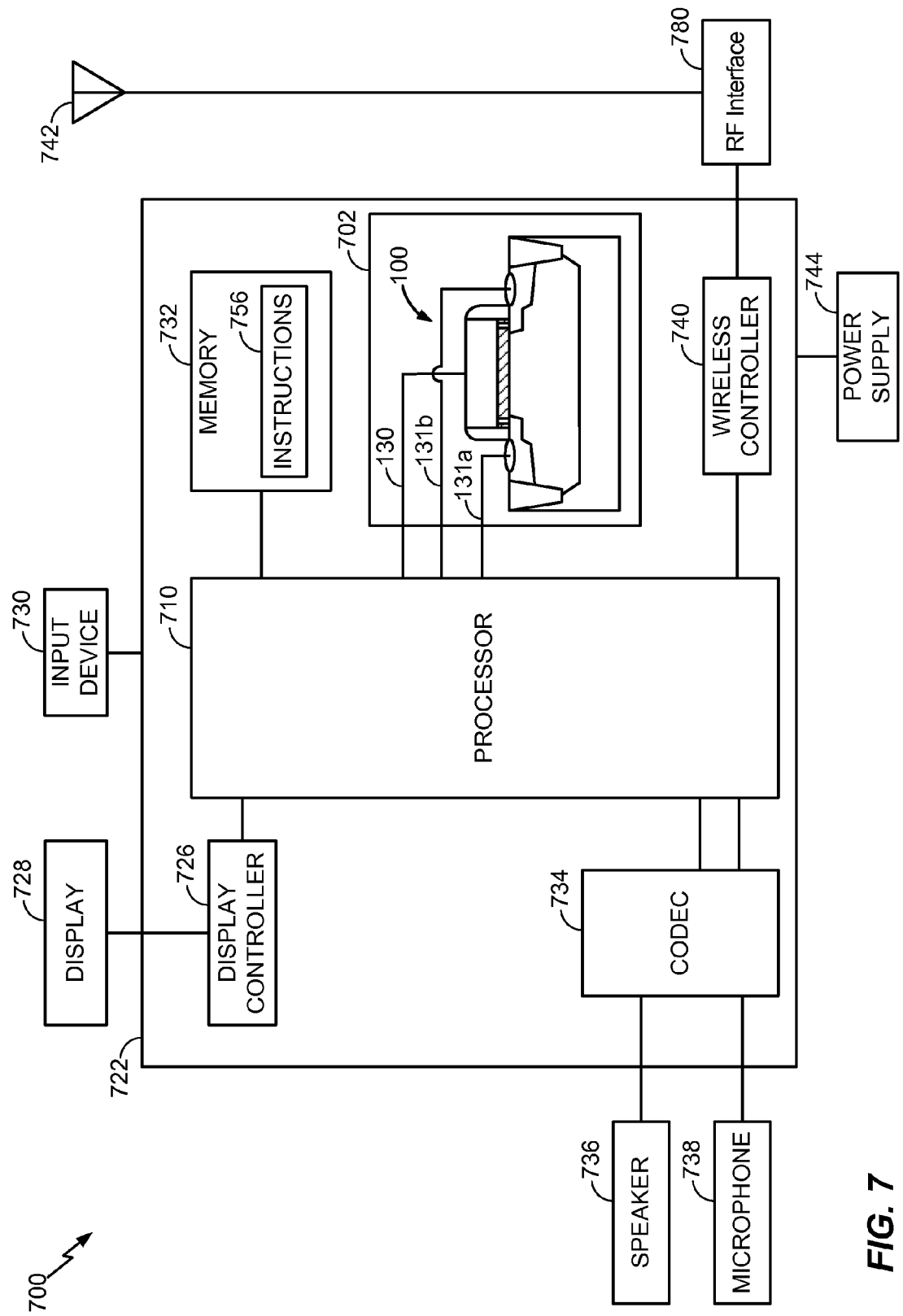
Figure 8:
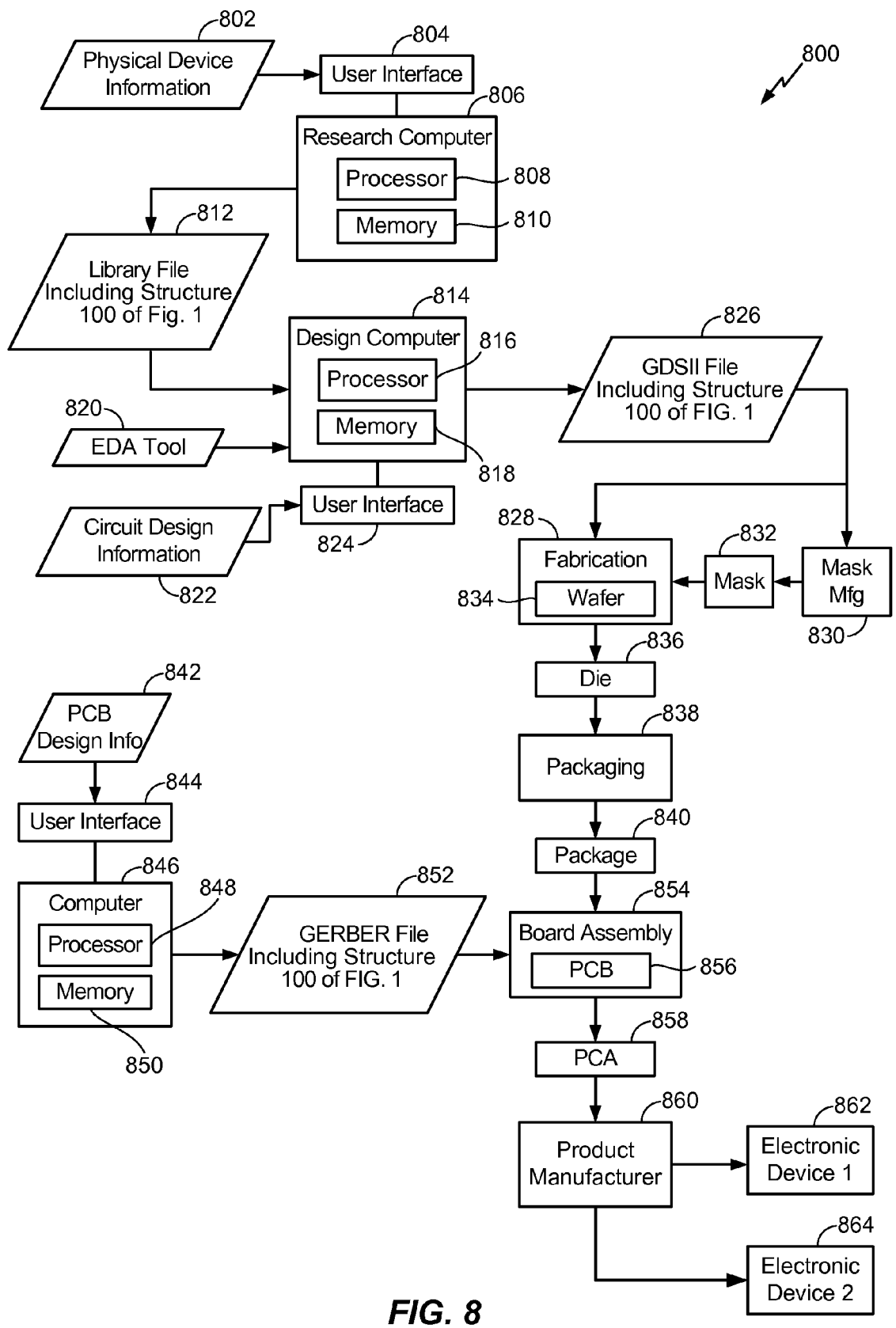

FIG. 7 is a block diagram of a wireless device including a component that is operable to selectively create a first breakdown condition and a second breakdown condition at a semiconductor transistor structure; and FIG. 8 is a data flow diagram of a particular illustrative embodiment of a manufacturing process to manufacture electronic devices that include a component that is operable to selectively create a first breakdown condition and a second breakdown condition at a semiconductor transistor structure.

VI. DETAILED DESCRIPTION

Figure 1:
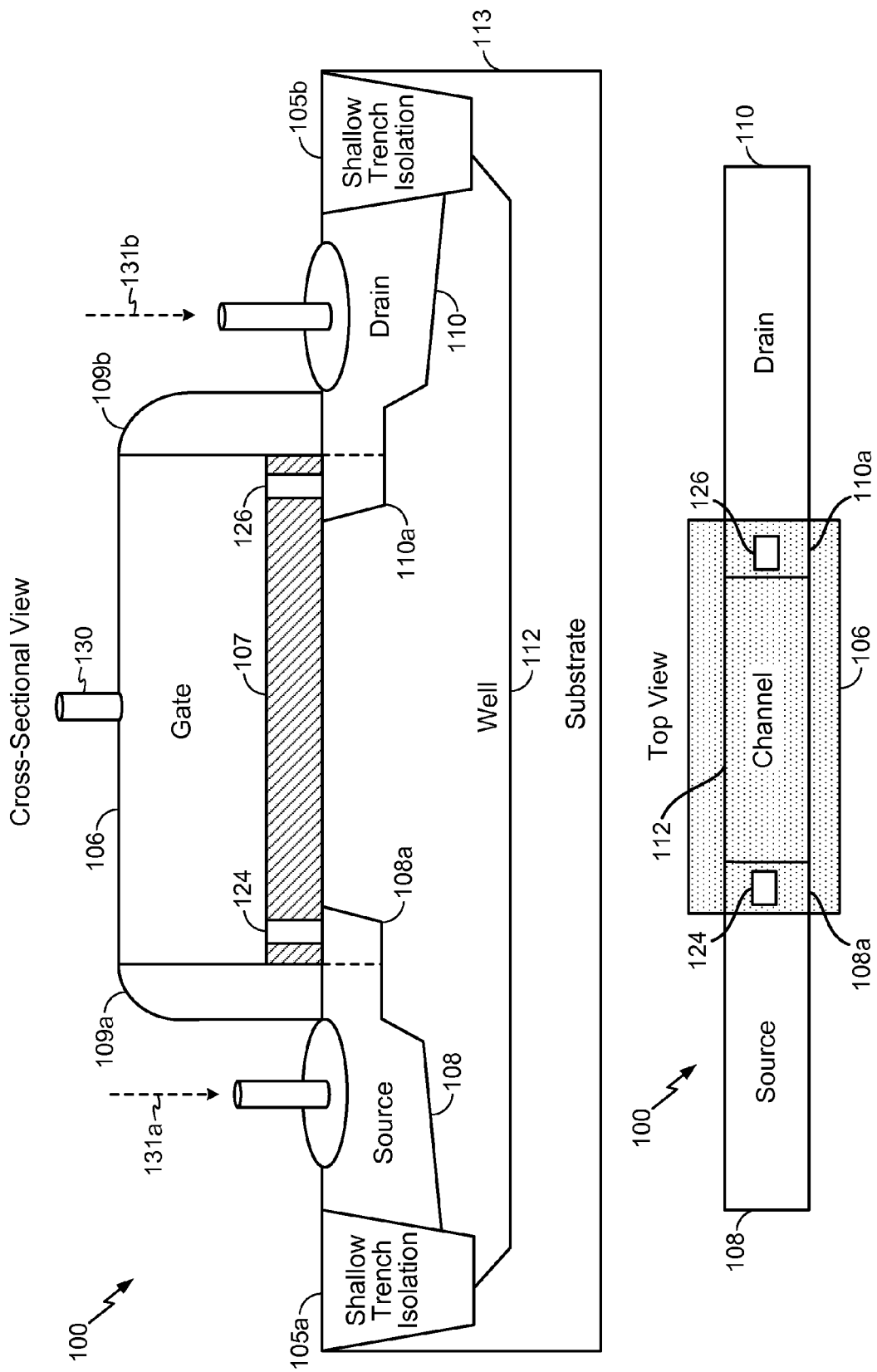
FIG. 1 is a diagram of a particular illustrative embodiment of a semiconductor transistor structure.

Referring to FIG. 1, a particular illustrative embodiment of a semiconductor transistor structure 100 is shown. A cross-sectional view of the semiconductor transistor structure 100 and a top view of the semiconductor transistor structure 100 are shown. In a particular embodiment, the semiconductor transistor structure 100 may include a p-type transistor, such as a p-type metal oxide semiconductor (PMOS) transistor or a p-type Fin field effect transistor (PFinFET). In another particular embodiment, the semiconductor transistor structure 100 may include an n-type transistor, such as an n-type metal oxide semiconductor (NMOS) transistor or an n-type Fin field effect transistor (NFinFET).

The semiconductor transistor structure 100 includes a gate 106, a source 108, a drain 110 and a well 112 (i.e., a channel region). A dielectric 107 separates the gate 106 from the source 108, from the drain 110, and from the well 112. The dielectric 107 may be an insulating layer comprised of a material with a high dielectric constant. In a particular illustrative embodiment of the semiconductor transistor structure 100, a source overlap region 108a is a particular area of the source 108 that extends under the gate 106 and the dielectric 107. A drain overlap region 110a is a particular area of the drain 110 that extends under the gate 106 and the dielectric 107. The overlap regions 108a, 110a may have lightly doped concentrations as opposed to regions of the source 108 and regions of the drain 110 with heavily doped concentrations. For example, if the source 108 and the drain 110 are doped with an N+ concentration, the overlap regions 108a, 110a may have lightly doped N+ concentrations as compared to the remaining areas of the source 108 and the drain 110. As another example, if the source 108 and the drain 110 are doped with a P+ concentration, the overlap regions 108a, 110a may have lightly doped P+ concentrations as compared to the remaining areas of the source and drain 108, 110. In other particular embodiments, the source 108 and the drain 110 may be doped with P− concentrations, and the source overlap region 108a and the drain overlap region 110a may have a lightly doped P− concentration. In another particular embodiment, the source 108 and the drain 110 may be doped with N− concentrations, and the source overlap region 108a and the drain overlap region 110a may have a lightly doped N− concentration.

The semiconductor transistor structure 100 further includes a spacer layer 109a, 109b that is configured to separate the source 108 and the drain 110 from the gate 106. The well 112 corresponds to a region of the semiconductor transistor structure 100 where a transistor (i.e., the n-type transistor or the p-type transistor) is implanted. The well 112 may have opposite doping characteristics of the source 108 and the drain 110. For example, when the source 108 and the drain 110 have a P+ concentration, the well 112 may have an N− concentration. As another example, when the source 108 and the drain 110 have an N+ concentration, the well 112 may have a P− concentration. A channel region may be formed within the well 112 between the source 108 and the drain 110. For example, a channel (i.e., a conduction path) may be formed within a portion of the well 112 that connects the source 108 with the drain 110.

The semiconductor transistor structure 100 further includes shallow trench isolation areas 105a, 105b that provide isolation and prevent electrical current leakage between adjacent semiconductor device components. For example, the semiconductor transistor structure 100 may be one of a plurality of adjacent semiconductor transistor structures in a memory, each semiconductor transistor structure corresponding to a single memory cell. The shallow trench isolation areas 105a, 105b may prevent current leakage from another semiconductor transistor structure in the memory affecting the semiconductor transistor structure 100 shown in FIG. 1. The semiconductor transistor structure 100 further includes a substrate 113. The well 112 and the shallow trench isolation areas 105a, 105b are formed within the substrate 113. Components of the plurality of adjacent semiconductor transistor structures in the memory may also be formed within the substrate 113. In a particular embodiment, the substrate 113 may be doped with a P− concentration.

During operation, a first breakdown condition 124 and/or a second breakdown condition 126 may be selectively created at the semiconductor transistor structure 100. The first breakdown condition 124 may be created by causing a first voltage difference between the gate 106 and the source overlap region 108a to exceed a breakdown voltage of the dielectric of the semiconductor transistor structure 100. The first breakdown condition 124 corresponds to a breakdown (i.e., a creation of a conductivity path) through the dielectric 107 between the gate 106 and the source overlap region 108a. The second breakdown condition 126 may be created by causing a second voltage difference between the gate 106 and the drain overlap region 110a to exceed the breakdown voltage of the dielectric of the semiconductor transistor structure 100. Creation of a conductivity path between the gate 106 and the well 112 (i.e., the channel region) may be prevented by biasing a body contact of the semiconductor transistor structure 100 to reduce the voltage difference between the gate 106 and the well 112 to less than the breakdown voltage of the dielectric of the semiconductor transistor structure 100.

The first breakdown condition 124 may correspond to a first programmable state of the semiconductor transistor structure 100 and may indicate a first logical value. The second breakdown condition 126 may correspond to a second programmable state of the semiconductor transistor structure 100 and may indicate a second logical value. In a particular embodiment, the first and second logical values may be equal (i.e., the first and second logical values may each correspond to a logical "1" or to a logical "0"). In an alternate embodiment, the first and second logical values may be different (i.e., the first logical value may correspond to a logical "1" while the second logical value corresponds to a logical "0", or vice versa).

In a first particular embodiment, the semiconductor transistor structure 100 may include an n-type transistor, such as an NMOS transistor or an NFinFET. The source 108 and the drain 110 may be doped with an N+ concentration and the overlap regions 108a, 110a may be doped with a lighter N+ concentration. The gate 106 may be N+ doped poly, an N type metal gate, or a P type metal gate. A P type metal gate may cause less dielectric breakdown voltage due to a self build electric field. As explained with respect to FIGS. 2-3, in this particular embodiment, the first and second breakdown conditions 124, 126 may correspond to a programming operation at the n-type transistor. A gate voltage may be applied to the gate 106 via a main word line 130, and a program voltage may be applied to the source 108 (and thus the source overlap region 108a) via a first current 131a flowing through a first access transistor 204. The program voltage may be greater than the gate voltage and large enough to cause an oxide or dielectric breakdown (i.e., the first breakdown condition 124) between the gate 106 and the source overlap region 108a. In addition or alternatively, the main word line 130 may apply the gate voltage to the gate 106, and a program voltage may be applied to the drain 110 (and thus the drain overlap region 110a) via a second current 131b flowing through a second access transistor 244. The program voltages may be passed from the first and second access transistors 204, 244, as described with respect to FIG. 2. As further described with respect to FIGS. 2-3, in this particular embodiment, a voltage difference between the gate 106 and the well 112 may be maintained at less than the breakdown voltage of the dielectric of the semiconductor transistor structure 100 by applying a well voltage to a body (i.e., to the well 112) of the n-type transistor via a well line (not shown). The well voltage may be approximately equal to the gate voltage. For example, as described with respect to FIG. 2, the gate voltage may be biased to ground via a word line and the well voltage may be biased to ground via a word line.

In a second particular embodiment, the semiconductor transistor structure 100 includes a p-type transistor, such as a PMOS transistor of a PFinFET. The source 108 and the drain 110 may be doped with a P+ concentration and the overlap regions 108a, 110a may be doped with a lighter P+ concentration. The gate 106 may be P+ doped poly, a P type metal gate, or an N type metal gate. An N type metal gate may cause less dielectric breakdown voltage due to a self build electric field. As described with respect to FIGS. 4-5, in this particular embodiment, the first and second breakdown conditions 124, 126 correspond to programming operations at the p-type transistor. A program voltage may be applied to the gate 106 via the main word line 130 and a drain voltage may be applied to the source 108 (and thus the source overlap region 108a) via a first current 131a flowing through an access transistor 204. In addition or alternatively, the main word line may apply the program voltage to the gate 106 and a drain voltage may be applied to the drain 110 (and thus the drain overlap region 110a) via a second current 131b flowing through another access transistor 244. The program voltage may be greater than the source/drain voltages and large enough to cause an oxide or dielectric breakdown (i.e., the first and second breakdowns 124, 126) between the gate 106 and the source and drain overlap regions 108a, 110a, respectively. As further explained with respect to FIGS. 4-5, in this particular embodiment, a voltage difference between the gate 106 and the well 112 may be maintained at less than the breakdown voltage of the dielectric of the semiconductor transistor structure 100 by applying a well voltage to a body (i.e., to the well 112) of the p-type transistor via a well line (not shown). A voltage difference between the well voltage and the program voltage may be small enough to prevent a gate oxide or dielectric breakdown between the gate 106 and the channel region (i.e., the well 112).

It will be appreciated that creating two breakdown conditions 124, 126 may reduce die area by permitting two logical states per cell, as opposed to having two cells with one logical state per cell as for one-time-programmable (OTP) devices.

Figure 2:
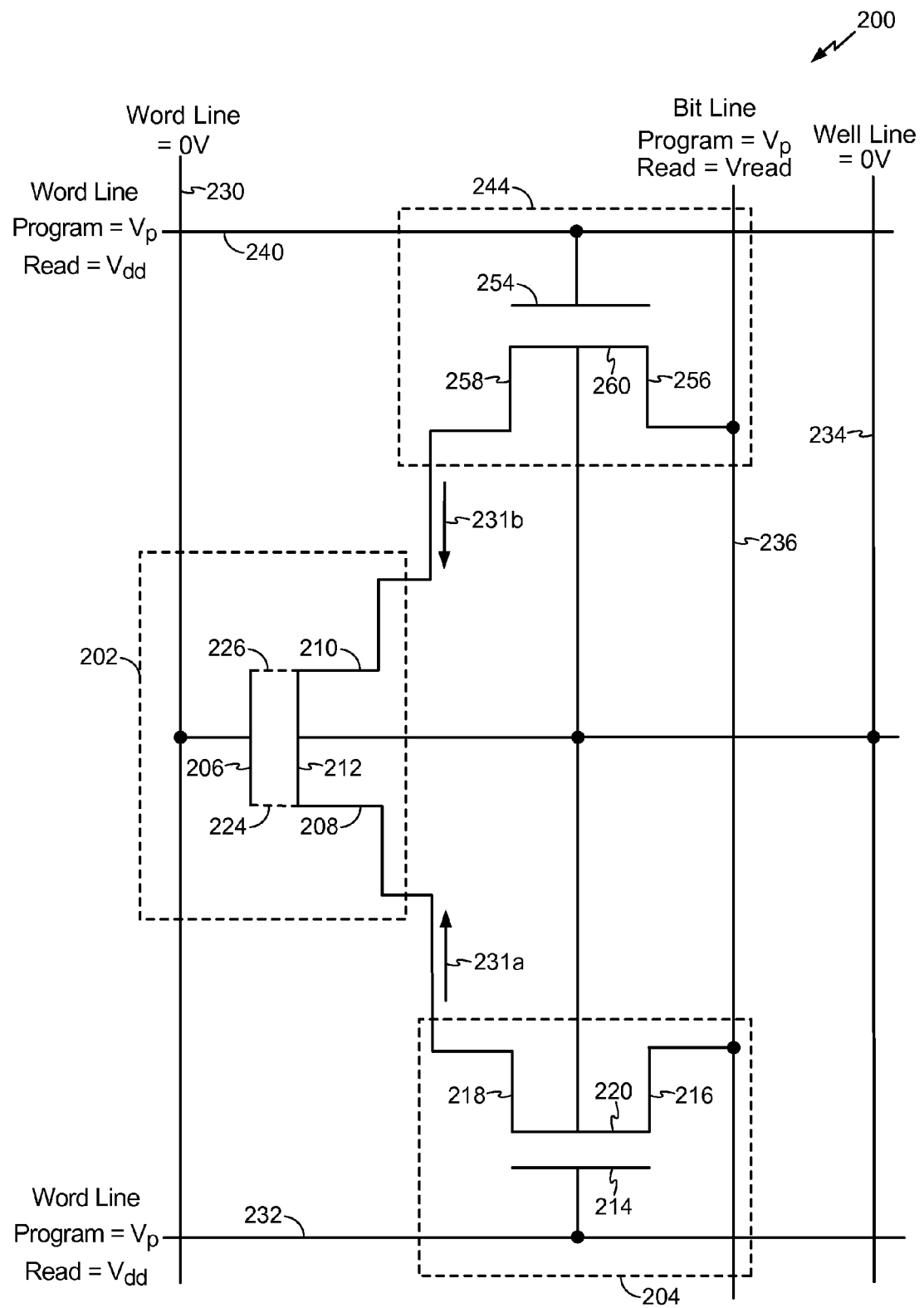
FIG. 2 is a diagram of a particular illustrative embodiment of a circuit that is operable to selectively create a first breakdown condition and a second breakdown condition at a semiconductor transistor structure.

Referring to FIG. 2, a particular illustrative embodiment of a circuit 200 that is operable to selectively create a first breakdown condition and a second breakdown condition at a semiconductor transistor structure is shown. The circuit 200 may be a circuit of a two-time-programmable (TTP) device (i.e., an n-type TTP device) that includes a semiconductor transistor structure 202, a first access transistor 204, and a second access transistor 244. The semiconductor transistor structure 202 may correspond to the semiconductor transistor structure 100 of FIG. 1. The semiconductor transistor structure 202 may be a main n-type core transistor, the first access transistor 204 may be a first n-type IO transistor, and the second access transistor 244 may be a second n-type IO transistor. A core transistor may have a thinner gate dielectric and lower dielectric breakdown voltage than an IO transistor. The n-type transistors may be NMOS transistors, NFinFETs, or any combination thereof. Two oxide or dielectric breakdown conditions 224, 226 may be reliably induced in the semiconductor transistor structure 202 using the first access transistor 204 and the second the second access transistor 244. As a result, the semiconductor transistor structure 202 may store up to two one-time-programmable (OTP) values that are independently readable via the first and second access transistors 204, 244.

The semiconductor transistor structure 202 (i.e., the main n-type transistor) includes a main gate 206, a main source 208, a main drain 210, and a main channel region 212. The first access transistor 204 (i.e., the first n-type transistor) includes a first gate 214, a first source 216, a first drain 218, and a first channel region 220. The second access transistor 244 (i.e., the second n-type transistor) includes a second gate 254, a second source 256, a second drain 258, and a second channel region 260. The main source 208 of the main n-type transistor is coupled to receive a first drain current 231a from the first drain 218 of the first n-type transistor and the main drain 210 of the main n-type transistor is coupled to receive a second drain current 231b from the second drain 258 of the second n-type transistor. The first drain current 231a may correspond to the first current 131a of FIG. 1 and the second drain current 231b may correspond to the second current 131b of FIG. 1.

The main gate 206 is coupled to a main word line 230 and is responsive to a voltage of the main word line 230. For example, a drain-to-source conductivity of the main n-type transistor may increase (i.e., turning the channel on) as the voltage of the main word line 230 increases above a threshold voltage. The first and second gates 214, 254 are coupled to a first and second word line 232, 240, respectively. The first gate 214 is responsive to a voltage of the first word line 232 and the second gate 254 is responsive to the second word line 240 in a similar manner as the main gate 206 is responsive to the main word line 230. The main channel region 212, the first channel region 220, and the second channel region 260 are coupled to a well line 234. The first source 216 and the second source 256 are coupled to a bit line 236.

During programming operations, the circuit 200 selectively creates a first breakdown condition 224 (i.e., creation of a conductivity path) and/or a second breakdown condition 226 at the semiconductor transistor structure 202. The first and second breakdown conditions 224, 226 may correspond to the first and second breakdown conditions 124, 126 of FIG. 1, respectively. The first breakdown condition 224 may be between a source overlap region of the semiconductor transistor structure 202 and the main gate 206 while the second breakdown condition 226 may be between a drain overlap region of the semiconductor transistor structure 202 and the main gate 206. The source overlap region corresponds to a region of the main source 208 extending under a gate oxide or dielectric of the main gate 206. The source overlap region may have a lightly doped N+ concentration (as opposed to a region with a heavily doped N+ concentration). The drain overlap region corresponds to a region of the main drain 210 extending under the gate oxide or dielectric of the main gate 206. The drain overlap region may have a lightly doped N+ concentration (as opposed to a region with a heavily doped N+ concentration). The "main source 208" and the "source overlap region" may be used interchangeably and the "main drain 210" and the "drain overlap region" may be used interchangeably. The gate film may be N+ type poly, an N type metal, or a P type metal gate. The gate dielectric film can be an oxide film or high-k dielectric film. The circuit device 200 may also prevent a breakdown condition between the main channel region 212 and the main gate 206.

The first breakdown condition 224 (at the main source 208 as opposed to at the main channel region 212) may correspond to a first programming operation and may be created by causing a first voltage difference between the main gate 206 and the source overlap region (i.e., the main source 208) to exceed a breakdown voltage of the main n-type transistor. The first voltage difference between the main gate 206 and the main source 208 may be caused by applying a gate voltage to the main gate 206 and applying a program voltage to the main source 208 (as opposed to the main drain 210 or the main channel region 212) via the first access transistor 204. The program voltage may be greater than the gate voltage, less than the main source 208 N+/P− junction breakdown voltage, but large enough to cause an oxide breakdown between the main gate 206 and the main source 208. For example, the main word line 230 may apply a gate voltage that is approximately equal to ground (i.e., zero volts) to the main gate 208 of the main n-type transistor. A system programming voltage (Vp) may be applied to the first gate 214 of the first access transistor 204 via the first word line 232 and to the first source 216 of the first access transistor 204 via the bit line 236. The well line 234 may apply a well voltage approximately equal to ground (i.e., zero volts) to the body contacts of the semiconductor transistor structure 202 and the first access transistor 204. As a result, the first access transistor 204 channel is turned on and channel conduction is enabled through the first channel region 220 due to the voltage difference between the first gate 214 (Vp) and the body bias (ground). The program voltage (e.g., the system programming voltage (Vp) minus a threshold voltage (Vt) of the first access transistor 204) is provided to the main source 208 of the semiconductor transistor structure 202.

Thus, the semiconductor transistor structure 202 channel is turned off and the source overlap region is selectively biasable to create the first breakdown condition 224. The first breakdown condition 224 occurs between the source overlap region and the main gate 206 in response to the first voltage difference between the main gate 206 and the main source 208 exceeding the dielectric breakdown voltage. Thus, the first drain current 231a flows along a program path from the bit line 236 through the first access transistor 204 to the main source 208, and across the gate oxide or dielectric to the main gate 206 of the semiconductor transistor structure 202.

In a similar manner, the second breakdown condition 226 may correspond to a second programming operation and may be created by causing a second voltage difference between the main gate 206 and the drain overlap region to exceed the breakdown voltage of the main n-type transistor. Causing the second voltage difference between the main gate 206 and the main drain 210 may also include applying the gate voltage to the main gate 206. However, when creating the second voltage difference, the program voltage may be applied to the main drain 210 (as opposed to the main source 208 or to the main channel region) via the second access transistor 244. In a similar fashion as with respect to the first access transistor 204, the system programming voltage (Vp) may be applied to the second gate 254 of the second access transistor 244 via the second word line 240 and to the second source 256 of the second access transistor 244 via the bit line 236. As a result, the program voltage is provided to the main drain 210 via the second access transistor 244 in a similar manner as the program voltage is applied to the main source 208 via the first access transistor 204. Thus, the drain overlap region is selectively biasable to create the second breakdown condition 226.

The circuit 200 may prevent a breakdown condition between the main channel region 212 and the main gate 206 by applying the gate voltage (i.e., a ground voltage) to the main gate 206 and applying the well voltage to the main channel region 212. The gate voltage may be approximately equal to the well voltage to keep the main channel region 212 turned off and to keep the voltage difference between the main gate 206 and the body contacts of the semiconductor transistor structure 202 at less than a dielectric breakdown voltage.

The first breakdown condition 224 may correspond to a first programmable state of the semiconductor transistor structure 202 and may indicate a first logical value. The second breakdown condition 226 may correspond to a second programmable state of the semiconductor transistor structure 202 and may indicate a second logical value. In a particular embodiment, the first and second logical values may be equal (i.e., the first and second logical values may each correspond to a logical "1" or to a logical "0"). In an alternate embodiment, the first and second logical values may be different (i.e., the first logical value may correspond to a logical "1" while the second logical value corresponds to a logical "0", or vice versa).

After the first and/or second breakdown condition 224, 226 is created, a first reading operation of the first breakdown condition 224 may be performed by applying a read voltage to the source overlap region and a second reading operation of the second breakdown condition 226 may be performed by applying the read voltage to the drain overlap region. For example, performing the reading operations may include applying the read voltage to the source overlap region by biasing the bit line 236 at a system read voltage ($V_{read}$) and biasing the first and second word lines 232, 240 at a system supply voltage (Vdd) while the main word line 230 and the well line 234 are grounded. The system read voltage ($V_{read}$) is less than the system supply voltage (Vdd) to prevent an oxide or dielectric breakdown of un-programmed cells and to prevent over-stressing a programmed cell's dielectric breakdown path. A read direction can be reversed by applying a read voltage ($V_{read}$) less than a threshold voltage to the gate 206 and keeping the source 208 or the drain 210 at a low voltage (ground).

It will be appreciated that creating two breakdown conditions 224, 226 (i.e., a TTP device) may reduce die area by permitting two logical states per cell as opposed to having two cells with one logical state per cell, as the case with one-time-programmable (OTP) devices. The circuit 200 may be programmed concurrently or serially and may be more reliable than an OTP device because the breakdown conditions 224, 226 may correspond to different resistances (i.e., different logical values) depending on the system programming voltages (Vp) applied to the first and second word lines 232, 240. For example, a read voltage may be applied (by a sensing circuit) to both breakdown conditions 224, 226 (as opposed to a single breakdown condition of an OTP device) and the sensing circuit may compare the read voltage to both breakdown conditions 224, 226. Comparing the read voltage to both breakdown conditions 224, 226 may reduce a sensing error that may be caused if one breakdown condition 224, 226 has a defect. It will also be appreciated that a lower read voltage may be applied to read the stored logical values corresponding to the breakdown conditions 224, 226 because the breakdown conditions 224, 226 are between the main gate 206 and the source/drain overlap regions. For example, in a particular embodiment, the system read voltage ($V_{read}$) may be less than 100 millivolts (mV). It will be appreciated that a lower system read voltage ($V_{read}$) may prevent over-stressing the main source 208 and/or the main drain 210, improve reliability of the TTP device, and may also reduce power consumption as compared to a larger read voltage.

Figure 3:
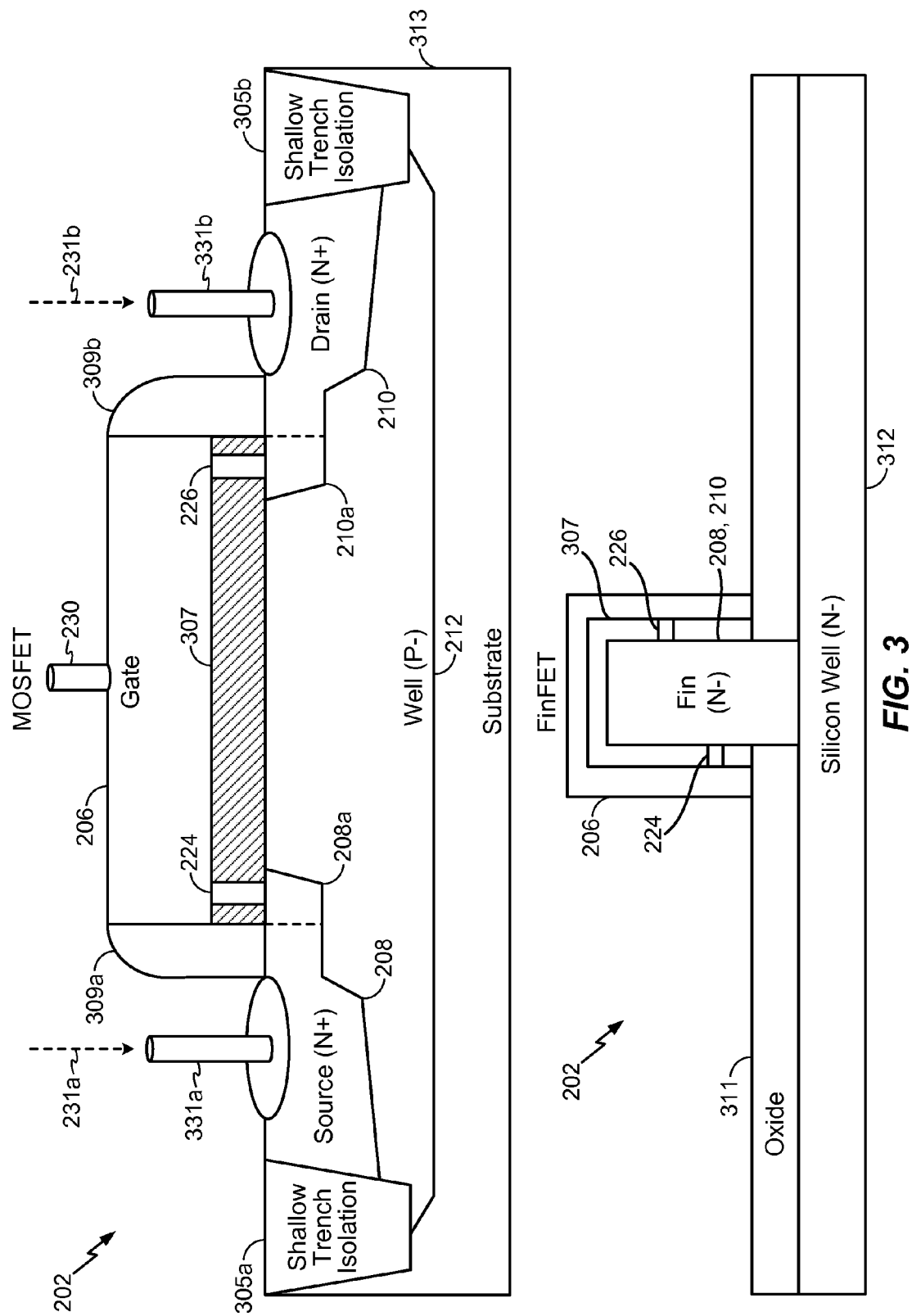
FIG. 3 is a diagram of a particular illustrative embodiment of the semiconductor transistor structure of FIG. 2.

Referring to FIG. 3, a particular illustrative embodiment of the semiconductor transistor structure 202 (i.e., the main n-type transistor) of FIG. 2 is shown. As shown, the semiconductor transistor structure 202 may be a metal-oxide semiconductor field-effect transistor (MOSFET) or a Fin field-effect transistor (FinFET).

Referring to the MOSFET implementation, the semiconductor transistor structure 202 includes the main gate 206, the main source 208, the main drain, and the main channel region 212 (i.e., a well). A source overlap region 208a is depicted in FIG. 3 and may correspond to the source overlap region described with respect to FIG. 2. A drain overlap region 210a is depicted in FIG. 3 and may correspond to the drain overlap region described with respect to FIG. 2. A dielectric 307 separates the main gate 206 from the main source 208, the source overlap region 208a, the main channel region 212, the main drain 210, and the drain overlap region 210a. The gate film may be an N+ type poly, an N type metal, or a P type metal gate.

The main channel region 212 may be a channel region between the main source 208 and the main drain 210. For example, a channel (i.e., a conduction path) may be established within the main channel region 212 that connects the main source 208 with the main drain 210 when gate voltage is larger than threshold voltage. During programming and read operation, channel conductivity is turned off by keeping the gate voltage less than a threshold voltage. The main channel region 212 may have opposite doping characteristics of the main source 208 (and the main drain 210). For example, the main source 208 has an N+ concentration and the main channel region 212 has a P– concentration.

The semiconductor transistor structure 202 includes a spacer layer 309a, 309b that is configured to separate the main source 208 from the main gate 206 and the main drain 210 from the main gate 206. The spacer layer 309a, 309b may correspond to the spacer layer 109a, 109b of FIG. 1 and may operate in a substantially similar manner as the spacer layer 109a, 109b of FIG. 1. The semiconductor transistor structure 202 further includes shallow trench isolation areas 305a, 305b that provide isolation and prevent electrical current leakage between adjacent semiconductor device components. The shallow trench isolation areas 305a, 305b may correspond to the shallow trench isolation areas 105a, 105b of FIG. 1 and may operate in a substantially similar manner as the shallow trench isolation areas 105a, 105b of FIG. 1. The semiconductor transistor structure 202 further includes a substrate 313. The main channel region 212 and the shallow trench isolation areas 305a, 305b are formed within the substrate 313. The substrate 113 is doped with a P– concentration. Alternatively, it also may be doped with an N– concentration. The substrate 313 may correspond to the substrate 113 of FIG. 1 and may function in a substantially similar manner as the substrate 113 of FIG. 1.

In a first particular embodiment, the main gate 206 may be comprised of an N type Metal or of an N+ concentration. During the programming operation of the first particular embodiment, the main word line 230 may apply the gate voltage to the main gate 206 and the program voltage may be applied to the main source 208 via a source connection 331a to create the first breakdown condition 224. For example, the first drain current 231a may be applied to the main source 208 via the source connection 331a. In addition or alternatively, the main word line 230 may apply the gate voltage to the main gate 206 and the program voltage may be applied to the main drain 210 via a drain connection 331b to create the second breakdown condition 226. For example, the second drain current 231b may be applied to the main drain 210 via the drain connection 331b. The gate voltage may be approximately zero volts and the well line 234 of FIG. 2 may apply a well voltage of approximately zero volts to the main channel region 212, turning off the main channel region 212. Thus, the breakdown conditions 224, 226 (i.e., program paths) are from the main gate 206 to the main source and drain 208, 210, respectively, as opposed to from the main gate 206 to the main channel region 212 because the gate-to-source voltage (e.g., approximately equal to the program voltage) is higher than the gate-to-well voltage (e.g., zero volts).

During the reading operation of the first particular embodiment, a first read path (i.e., the first breakdown condition 224) is from the main gate 206 to the main source 208 (i.e., source overlap region 208a) and a second read path (i.e., the second breakdown condition 226) is from the main gate 206 to the main drain 210 (i.e., drain overlap region 210a). The gate voltage may be approximately zero and the read voltage may be applied to the main source 208 via the source connection 331a and to the main drain 210 via the drain connection 331b. As explained with respect to FIG. 2, a reduced system read voltage ($V_{read}$) (e.g., 100 mV) may be used to avoid over-stressing the main source 208 and the main drain 210 and improve reliability. A read direction can be reversed by applying a read voltage ($V_{read}$) less than a threshold voltage to the gate 206 and keeping the source 208 or the drain 210 at a low voltage (ground).

In a second particular embodiment, the main gate 206 may be comprised of a P type Metal. The programming operation of the second particular embodiment may function in a similar manner as the programming operation of the first particular embodiment. The reading operation of the second particular embodiment may function in a similar manner as the reading operation of the first particular embodiment.

Referring to the FinFET implementation, the main source 208 and the main drain 210 (of the MOSFET implementation) may be implemented as a fin 208, 210 (i.e., a source-drain channel) protruding from a surface of a silicon well 312. The silicon well 312 may be comprised of an N– concentration. The silicon well 312 may correspond to the main channel region 212 of FIG. 2. The dielectric 307 may be placed around the fin 208, 210, and the main gate 206 may be placed around the dielectric 307. An oxide layer 311 may be placed on the silicon well 312 to isolate the main gate 206 and the dielectric 307 from silicon well 312. The first breakdown condition 224 and the second breakdown condition 226 may be created in a similar manner as described with respect to the MOSFET implementation.

The implementations of the semiconductor transistor structure 202 shown in FIG. 3 may be implemented in the circuit 200 of FIG. 2. It will be appreciated that in the first particular embodiment of the semiconductor transistor structure 202 described with respect to the MOSFET implementation of FIG. 3, the system programming voltage (Vp) applied to the first and second gates 214, 254 of the first and second access transistors 204, 244, respectively, may be lower than the system programming voltage (Vp) in the first particular embodiment of the semiconductor transistor structure 202 described with respect to the MOSFET or Finfet implementation. For example, due to the P type Metal composition of the main gate 206 and the N+ concentration of the main source and drain 208, 210 in the second particular embodiment, a lower system programming voltage (Vp) may be required as compared to the first embodiment. Reducing the programming voltage (Vp) may reduce power consumption.

Figure 4:
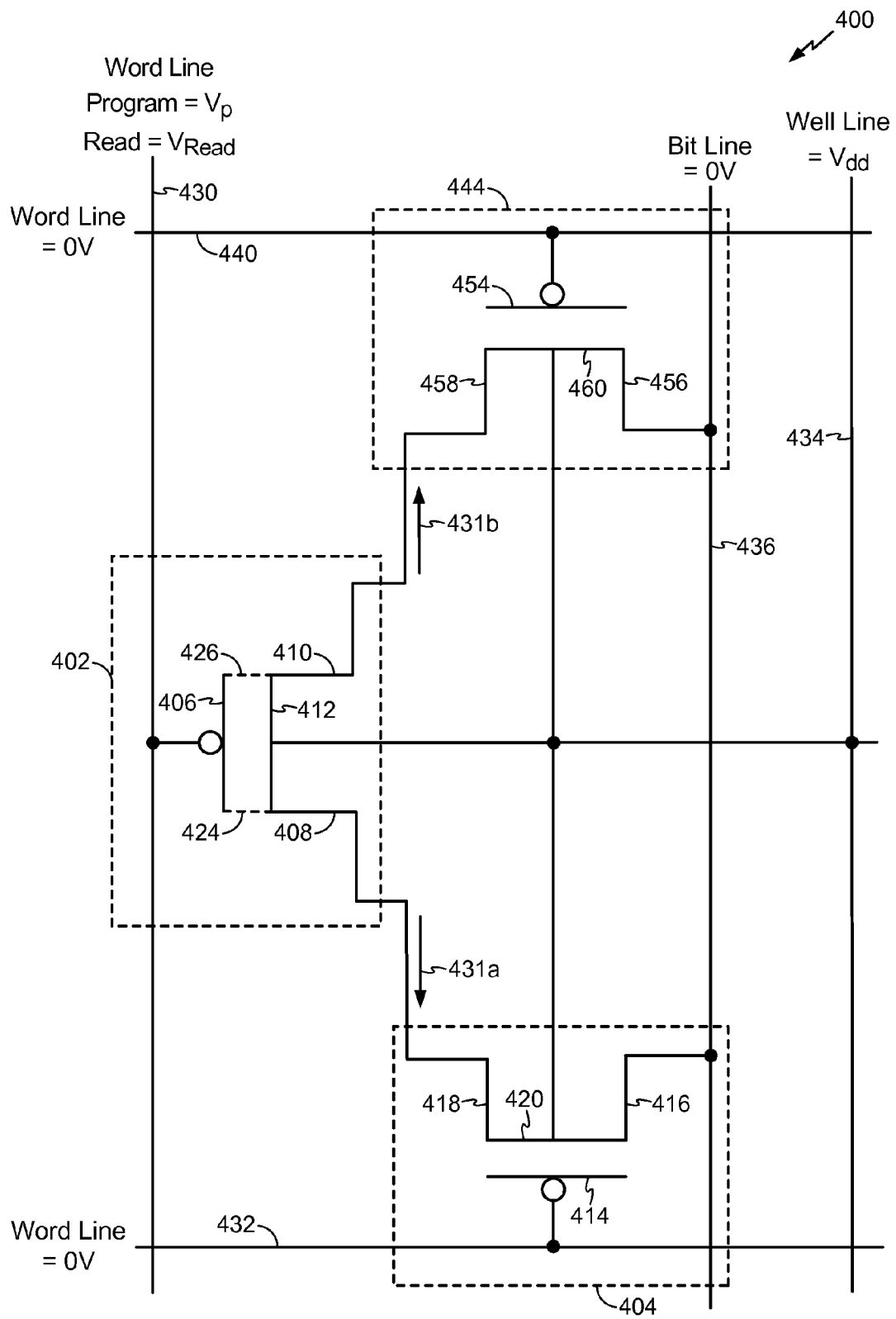
FIG. 4 is another diagram of a particular illustrative embodiment of a circuit that is operable to selectively create a first breakdown condition and a second breakdown condition at a semiconductor transistor structure.

Referring to FIG. 4, a particular illustrative embodiment of a circuit 400 that is operable to selectively create a first breakdown condition and a second breakdown condition at a semiconductor transistor structure is shown. The circuit 400 may be a circuit of a two-time-programmable (TTP) device (i.e., a p-type TTP device) that includes a semiconductor transistor structure 402, a first access transistor 404, and a second access transistor 444. The semiconductor transistor structure 402 may correspond to the semiconductor transistor structure 100 of FIG. 1. The semiconductor transistor structure 402 may be a main p-type core transistor, the first access transistor 404 may be a first p-type IO transistor, and the second access transistor 444 may be a second p-type IO transistor. A core transistor may have a thinner gate dielectric and lower dielectric breakdown voltage than an IO transistor. The p-type transistors may be PMOS transistors, PFinFETs, or any combination thereof. Two oxide breakdown conditions 424, 426 may be reliably induced in the semiconductor transistor structure 402 using the first access transistor 404 and the second the second access transistor 444. As a result, the semiconductor transistor structure 402 may store up to two one-time-programmable (OTP) values that are independently readable via the first and second access transistors 404, 444.

The semiconductor transistor structure 402 (i.e., the main p-type transistor) includes a main gate 406, a main source 408, a main drain 410, and a main channel region 412. The first access transistor 404 (i.e., the first p-type transistor) includes a first gate 414, a first source 416, a first drain 418, and a first channel region 420. The second access transistor 444 (i.e., the second p-type transistor) includes a second gate 454, a second source 456, a second drain 458, and a second channel region 460. The main source 408 of the main p-type transistor is coupled to the first drain 418 of the first p-type transistor to provide a first drain current 431a to the first drain 418 of the first p-type transistor, and the main drain 410 of the main p-type transistor is coupled to the second drain 458 of the second p-type transistor to provide a second drain current 431b to the second drain 458 of the second p-type transistor. The first drain current 431a may correspond to the first current 131a of FIG. 1 and the second drain current 431b may correspond to the second current 131b of FIG. 1.

The main gate 406 is coupled to a main word line 430 and is responsive to a voltage of the main word line 430. For example, a drain-to-source conductivity of the main p-type transistor may increase as the voltage of the main word line 430 falls below a threshold voltage. During programming and read operation, channel conductivity of the semiconductor transistor structure 202 is turned off by applying a positive voltage to the main gate 406. The first and second gates 414, 454 are coupled to a first and second word line 432, 440, respectively. The first gate 414 is responsive to a voltage of the first word line 432 and the second gate 454 is responsive to the second word line 440 in a similar manner as the main gate 406 is responsive to the main word line 430. The main channel region 412, the first channel region 420, and the second channel region 460 are coupled to a well line 434. The first source 416 and the second source 456 are coupled to a bit line 436.

During programming operations, the circuit 400 selectively creates a first breakdown condition 424 (i.e., creation of a conductivity path) and/or a second breakdown condition 426 at the semiconductor transistor structure 402. The first and second breakdown conditions 424, 426 may correspond to the first and second breakdown conditions 124, 126 of FIG. 1, respectively. The first breakdown condition 424 may be between a source overlap region of the semiconductor transistor structure 402 and the main gate 406 while the second breakdown condition 426 may be between a drain overlap region of the semiconductor transistor structure 402 and the main gate 406. The source overlap region corresponds to a region of the main source 408 extending under a gate oxide or dielectric of the main gate 406. The source overlap region may have a lightly doped P+ concentration (as opposed to a region with a heavily doped P+ concentration). The drain overlap region corresponds to a region of the main drain 410 extending under the gate oxide or dielectric of the main gate 406. The drain overlap region may have a lightly doped P+ concentration (as opposed to a region with a heavily doped P+ concentration). The "main source 408" and the "source overlap region" may be used interchangeably and the "main drain 410" and the "drain overlap region" may be used interchangeably. The circuit 400 may also prevent a breakdown condition between the main channel region 412 and the main gate 406.

The first breakdown condition 424 (at the main source 408 as opposed to at the main channel region 412) may correspond to a first programming operation and may be created by causing a first voltage difference between the main gate 406 and the source overlap region (i.e., the main source 408) to exceed a breakdown voltage of the main p-type transistor. The first voltage difference between the main gate 406 and the main source 408 may be caused by applying a system programming voltage (Vp) to the main gate 406 and applying a drain voltage (e.g., a threshold voltage (Vt)) to the main source 408 (as opposed to the main drain 410 or the main channel region 412) via the first access transistor 404. For example, a ground voltage (i.e., zero volts) is applied to the bit line 436 and to the first word line 432 to enable conduction of the first access transistor 404. A system programming voltage (Vp) may be provided to the main gate 406 by the main word line 430 and a drain voltage (e.g., approximately the threshold voltage (Vt) of the first access transistor 404) may be provided to the main source 408 via the first access transistor 404. The well line 434 may provide a system supply voltage (Vdd) to the body contact of the semiconductor transistor structure 402 to bias the main channel region 412 and cause the first breakdown condition 424 near the main source 408. Thus, the source overlap region (i.e., the main source 408) is selectively biasable to create the first breakdown condition 424. The first breakdown condition 424 occurs between the source overlap region and the main gate 406 in response to the first voltage difference between the main gate 406 and the main source 408 exceeding the breakdown voltage. Thus, a current flows along a program path from the main gate 406 and across the gate oxide of the semiconductor transistor structure 402 to the bit line 436 through the main source 408 and the first access transistor 404.

In a similar manner, the second breakdown condition 426 may correspond to a second programming operation and may be created by causing a second voltage difference between the main gate 406 and the drain overlap region to exceed the breakdown voltage of the main p-type transistor. Causing the second voltage difference between the main gate 406 and the main drain 410 may also include applying the system programming voltage (Vp) to the main gate 406. However, when creating the second voltage difference, the drain voltage may be applied to the main drain 410 (as opposed to the main source 408 or to the main channel region) via the second access transistor 444. In a similar fashion as with respect to the first access transistor 404, a ground voltage may be applied to the second gate 454 of the second access transistor 444 via the second word line 440 and to the second source 456 of the second access transistor 444 via the bit line 436. As a result, the drain voltage is provided to the main drain 410 via the second access transistor 444 in a similar manner as the drain voltage is applied to the main source 408 via the first access transistor 404. Thus, the drain overlap region is selectively biasable to create the second breakdown condition 426.

The circuit 400 may prevent a breakdown condition between the main channel region 412 and the main gate 406 by applying the system programming voltage (Vp) to the main gate 406 and applying a system supply voltage (Vdd) (i.e., a well voltage) to the main channel region 412. Channel conductivity of the semiconductor transistor structure 402 may be off during programming and during read operations. The voltage difference between the system programming voltage (Vp) and the system supply voltage (Vdd) may be less than the breakdown voltage of the semiconductor transistor structure 402, thus preventing a breakdown condition between the main channel region 412 and the main gate 406.

The first breakdown condition 424 may correspond to a first programmable state of the semiconductor transistor structure 402 and may indicate a first logical value. The second breakdown condition 426 may correspond to a second programmable state of the semiconductor transistor structure 402 and may indicate a second logical value. In a particular embodiment, the first and second logical values may be equal (i.e., the first and second logical values may each correspond to a logical "1" or to a logical "0"). In an alternate embodiment, the first and second logical values may be different (i.e., the first logical value may correspond to a logical "1" while the second logical value corresponds to a logical "0", or vice versa).

After the first and/or second breakdown condition 424, 426 is created, a first reading operation of the first breakdown condition 424 may be performed by biasing the main word line at a system read voltage ($V_{read}$) (i.e., applying the system read voltage ($V_{read}$) to the main gate 406). A first read path is from the main gate 406 to the main source 408 of the semiconductor transistor structure 202 and may read the stored logical value created by the first breakdown condition 424. A second read path is from the main gate 406 to the main drain 410 and may read the stored logical value created by the second breakdown condition 426. The system read voltage ($V_{read}$) is less than the system programming voltage (Vp) and supply voltage (Vdd) to prevent an oxide breakdown of un-programmed cells and over-stressing of programmed cells.

It will be appreciated that creating two breakdown conditions 424, 426 (i.e., a TTP device) may reduce die area by permitting two logical states per cell as opposed to having two cells with one logical state per cell, as the case with one-time-programmable (OTP) devices. The circuit 400 may be programmed concurrently or serially and may be more reliable than an OTP device because the breakdown conditions 424, 426 may correspond to different resistances (i.e., different logical values) depending on the system programming voltages (Vp) applied to the gate 406 via the first and second word lines 432, 440. For example, a read voltage may be applied (by a sensing circuit) to both breakdown conditions 424, 426 (as opposed to a single breakdown condition of an OTP device) and the sensing circuit may compare the read voltage to both breakdown conditions 424, 426. Comparing the read voltage to both breakdown conditions 424, 426 may reduce a sensing error that may be caused if one breakdown condition 424, 426 has a defect. It will also be appreciated that a lower read voltage may be applied to read the stored logical values corresponding to the breakdown conditions 424, 426 because the breakdown conditions 424, 426 are between the main gate 406 and the source/drain overlap regions. For example, in a particular embodiment, the system read voltage ($V_{read}$) may be less than 100 millivolts (mV). It will be appreciated that a lower system read voltage ($V_{read}$) may prevent over-stressing the main source 408 and/or the main drain 410, may also reduce power consumption as compared to a larger read voltage, and may improve TTP device reliability. A read direction can be reversed by applying a read voltage ($V_{read}$) less than the well voltage to the source 408 or drain 410 and keeping the gate 406 at a low voltage (i.e., ground).

Figure 5:
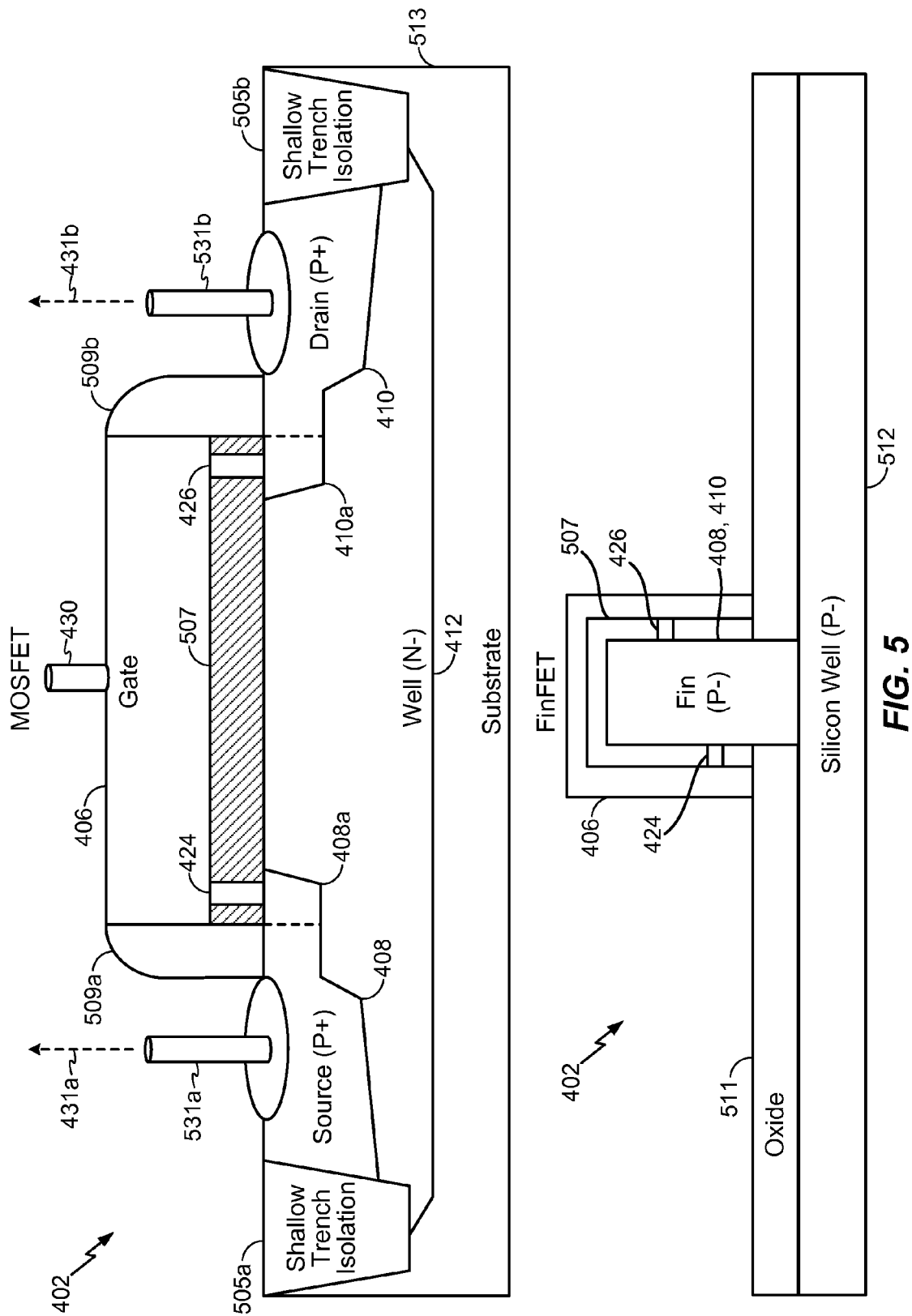
FIG. 5 is a diagram of a particular illustrative embodiment of the semiconductor transistor structure of FIG. 4

Referring to FIG. 5, a particular illustrative embodiment of the semiconductor transistor structure 402 (i.e., the main p-type transistor) of FIG. 4 is shown. As shown, the semiconductor transistor structure 402 may be a metal-oxide semiconductor field effect transistor (MOSFET) or a Fin field-effect transistor (FinFET).

Referring to the MOSFET implementation, the semiconductor transistor structure 402 includes the main gate 406, the main source 408, the main drain 410, and the main channel region 412 (i.e., a well). A source overlap region 408a is depicted in FIG. 5 and may correspond to the source overlap region described with respect to FIG. 4. A drain overlap region 410a is depicted in FIG. 5 and may correspond to the drain overlap region described with respect to FIG. 4. A dielectric 507 separates the main gate 406 from the main source 408, the source overlap region 408a, the main channel region 412, the main drain 410, and the drain overlap region 410a.

The main channel region 412 may be a channel region between the main source 408 and the main drain 410. For example, a channel (i.e., a conduction path) may be established within the main channel region 412 that connects the main source 408 with the main drain 410 when the gate-to-source voltage (Vgs) is less than threshold voltage. During programming and read operations, channel conductivity may remain at an "off" status by maintaining the gate-to-source voltage (Vgs) at less than the threshold voltage. The main channel region 412 may have opposite doping characteristics of the main source 408 (and the main drain 410). For example, the main source 408 has a P+ concentration and the main channel region 412 has an N− concentration.

The semiconductor transistor structure 402 includes a spacer layer 509a, 509b that is configured to separate the main source 408 from the main gate 406 and the main drain 410 from the main gate 406. The spacer layer 509a, 509b may correspond to the spacer layer 109a, 109b of FIG. 1 and may operate in a substantially similar manner as the spacer layer 109a, 109b of FIG. 1. The semiconductor transistor structure 402 further includes shallow trench isolation areas 505a, 505b that provide isolation and prevent electrical current leakage between adjacent semiconductor device components. The shallow trench isolation areas 505a, 505b may correspond to the shallow trench isolation areas 105a, 105b of FIG. 1 and may operate in a substantially similar manner as the shallow trench isolation areas 105a, 105b of FIG. 1. The semiconductor transistor structure 402 further includes a substrate 513. The main channel region 412 and the shallow trench isolation areas 505a, 505b are formed within the substrate 513. The substrate 113 is doped with a P– concentration. The substrate 513 may correspond to the substrate 113 of FIG. 1 and may function in a substantially similar manner as the substrate 113 of FIG. 1.

In a first particular embodiment, the main gate 406 may be comprised of a P type Metal or of a P+ concentration. During the programming operation of the first particular embodiment, the main word line 430 may apply the system programming voltage (Vp) to the main gate 406 and the source voltage (of the first access transistor 404) may be applied to the main source 408 via a source connection 531a to create the first breakdown condition 424. For example, the first source current 431a may be applied to the main source 408 via the source connection 531a. In addition or alternatively, the main word line 430 may apply system programming voltage (Vp) to the main gate 406 and the drain voltage (of the second access transistor 444) may be applied to the main drain 410 via a drain connection 531b to create the second breakdown condition 426. For example, second drain current 431b may be applied to the main drain 410 via the drain connection 531b. The well line 434 of FIG. 4 may apply the well voltage (i.e., the system supply voltage (Vdd)) to the main channel region 412 to prevent a breakdown condition from occurring at the main channel region 412. Thus, the breakdown conditions 424, 426 (i.e., program paths) are from the main gate 406 to the main source and drain 408, 410, respectively, as opposed to from the main gate 406 to the main channel region 412 because the gate-to-source voltage is higher than the gate-to-well voltage.

During the reading operation of the first particular embodiment, a first read path (i.e., the first breakdown condition 424) is from the main gate 406 to the main source 408 (i.e., source overlap region 408a) and a second read path (i.e., the second breakdown condition 426) is from the main gate 406 to the main drain 410 (i.e., drain overlap region 410a). During the reading operation, the system read voltage ($V_{read}$) may be applied to the main gate 406 via the main word line 430. As explained with respect to FIG. 4, a reduced system read voltage ($V_{read}$) (e.g., 100 mV or less) may be used to avoid over-stressing the main source 408 and the main drain 410 and to improve reliability.

In a second particular embodiment, the main gate 406 may be comprised of an N type Metal. The programming operation of the second particular embodiment may function in a similar manner as the programming operation of the first particular embodiment. The reading operation of the second particular embodiment may function in a similar manner as the reading operation of the first particular embodiment.

Referring to the FinFET implementation, the main source 408 and the main drain 410 (of the MOSFET implementation) may be implemented as a fin 408, 410 (i.e., a source-drain region) protruding from a surface of a silicon well 512. The silicon well 512 may be comprised of a P– concentration. Alternatively, it also can be comprised of a N– concentration. The silicon well 512 may correspond to the main channel region 412 of FIG. 4. The dielectric 507 may be placed around the fin 408, 410, and the main gate 406 may be placed around the dielectric 507. An oxide layer 511 may be placed on the silicon well 512 to isolate the main gate 406 and the dielectric 507 from silicon well 512. The first breakdown condition 424 and the second breakdown condition 426 may be created in a similar manner as described with respect to the MOSFET implementation.

The implementations of the semiconductor transistor structure 402 shown in FIG. 5 may be implemented in the circuit 400 of FIG. 4. It will be appreciated that in the first particular embodiment of the semiconductor transistor structure 402 described with respect to the MOSFET or Finfet implementation of FIG. 5, the system programming voltage (Vp) applied to the main gate 406 may be lower than the system programming voltage (Vp) in the second particular embodiment of the semiconductor transistor structure 402 described with respect to the MOSFET or Finfet implementation. For example, due to the N type Metal composition of the main gate 406 and the P+ concentration of the main source and drain 408, 410 in the second particular embodiment, a lower system programming voltage (Vp) may be required as compared to the first embodiment. Reducing the programming voltage (Vp) may reduce power consumption.

Figure 6:
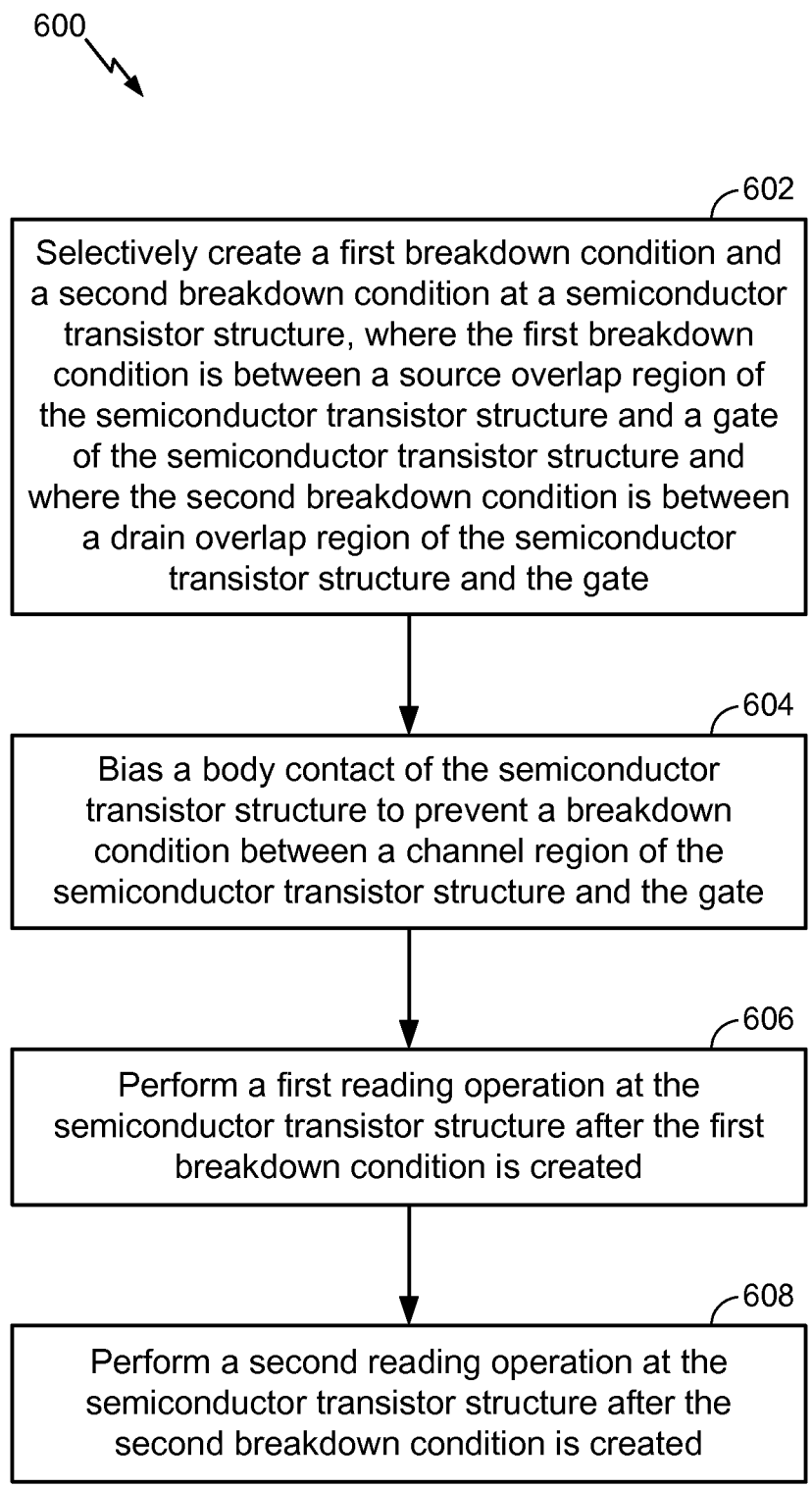
FIG. 6 is a flowchart of a particular embodiment of a method of selectively creating a first breakdown condition and a second breakdown condition at a semiconductor transistor structure.

Referring to FIG. 6, flowchart of a particular embodiment of a method 600 of selectively creating a first breakdown condition and a second breakdown condition at a semiconductor transistor structure is shown. In an illustrative embodiment, the method 600 may be performed using the semiconductor transistor structure 100 of FIG. 1, the circuit 200 of FIG. 2, the semiconductor transistor structure 202 of FIG. 3, the circuit 400 of FIG. 4, or the semiconductor transistor structure 402 of FIG. 5.

The method includes selectively creating a first breakdown condition and a second breakdown condition at a semiconductor transistor structure, at 602. For example, in the first particular embodiment of FIG. 1, the gate voltage may be applied to the gate 106 via the main word line 130 and the program voltage may be applied to the source 108 (and thus the source overlap region 108a) via the first current 131a flowing through a first access transistor, such as the first access transistor 404 of FIG. 2. In addition or alternatively, the main word line 130 may apply the gate voltage to the gate 106 and the program voltage may be applied to the drain 110 (and thus the drain overlap region 110a) via a second current 131b flowing through a second access transistor, such as the second access transistor 444 of FIG. 2. The program voltage may be greater than the gate voltage and large enough to cause the first breakdown condition 124 between the gate 106 and the source overlap region 108a and the second breakdown condition 126 between the gate 106 and the drain overlap region 110a.

As another example, in the second embodiment of FIG. 1, the program voltage may be applied to the gate 106 via the main word line 130 and a drain voltage may be applied to the source 108 (and thus the source overlap region 108a) via a first current 131a flowing through a first access transistor, such as the first access transistor 404 of FIG. 4. In addition or alternatively, the main word line 130 may apply the program voltage to the gate 106 and a drain voltage may be applied to the drain 110 (and thus the drain overlap region 110a) via a second current 131b flowing through a second access transistor, such as the second access transistor 444 of FIG. 4. The program voltage may be greater than the drain voltages and large enough to cause an oxide or dielectric breakdown (i.e., the first and second breakdown conditions 124, 126) between the gate 106 and the source and drain overlap regions 108a, 110a, respectively.

A body contact of the semiconductor transistor structure may be biased to prevent a breakdown condition between a channel region of the semiconductor transistor structure and the gate, at 604. For example, in FIG. 2, the well line 234 may bias a body contact (i.e., the well in FIG. 3) of the semiconductor transistor structure 202 to approximately ground to prevent a breakdown condition between the main channel region 212 and the main gate 206. As another example, in FIG. 4, the well line 434 may bias a body contact (the well in FIG. 5) of the semiconductor transistor structure 402 to approximately the system supply voltage (Vdd) to prevent a breakdown condition between the main channel region 412 and the main gate 406.

A first reading operation may be performed at the semiconductor transistor structure after the first breakdown condition is created, at 606. For example, in FIG. 2, the first reading operation may be performed by applying the read voltage to the source overlap region by biasing the bit line 236 at the system read voltage ($V_{read}$) and biasing the first word line 232 at a system supply voltage (Vdd) while main word line 230 and the well line 234 are grounded. As another example, in FIG. 4, the first reading operation may be performed by biasing the main word line at a system read voltage ($V_{read}$) (i.e., applying the system read voltage ($V_{read}$) to the main gate 206).

A second reading operation may be performed at the semiconductor transistor structure after the second breakdown condition is created, at 608. For example, in FIG. 2, the second reading operation may be performed by applying the read voltage to the drain overlap region by biasing the bit line 236 at the system read voltage ($V_{read}$) and biasing the second word line 240 at a system supply voltage (Vdd) while main word line 230 and the well line 234 are grounded. As another example, in FIG. 4, the first reading operation may be performed by biasing the main word line at a system read voltage ($V_{read}$) (i.e., applying the system read voltage ($V_{read}$) to the main gate 206).

It will be appreciated that the method 600 of FIG. 6 may create two breakdown conditions 424, 426 (i.e., a TTP device) which may reduce die area by permitting two logical states per cell as opposed to having two cells with one logical state per cell, as the case with one-time-programmable (OTP) devices.

Referring to FIG. 7, a block diagram of a wireless device 700 including a component that is operable to create a breakdown condition at a semiconductor transistor structure is shown. The device 700 includes a processor 710, such as a digital signal processor (DSP), coupled to a memory 732.

FIG. 7 also shows a display controller 726 that is coupled to the processor 710 and to a display 728. A coder/decoder (CODEC) 734 can also be coupled to the processor 710. A speaker 736 and a microphone 738 can be coupled to the CODEC 734. FIG. 7 also indicates that a wireless controller 740 can be coupled to the processor 710 and to an antenna 742 via a radio-frequency (RF) interface 790 disposed between the wireless controller 740 and the antenna 742. A two-time-programmable (TTP) device 702 may also be coupled to the processor 710. The TTP device 702 may correspond to the circuit 200 of FIG. 2 or the circuit 400 of FIG. 4. In the particular embodiment, the TTP device 702 includes the semiconductor transistor structure 100 of FIG. 1. The semiconductor transistor structure 100 may correspond to the semiconductor transistor structure 202 of FIGS. 2-3 or to the semiconductor transistor structure 402 of FIGS. 4-5.

The memory 732 may be a tangible non-transitory processor-readable storage medium that includes executable instructions 756. The instructions 756 may be executed by a processor, such as the processor 710, to selectively create a first breakdown condition and a second breakdown condition at a semiconductor transistor structure. The first breakdown condition may be between a source overlap region of the semiconductor structure and a gate of the semiconductor structure and the second breakdown condition may be between a drain overlap region of the semiconductor transistor structure and the gate. For example, the processor 710 may control a bias to the main word line 130 at the gate voltage according to the first particular embodiment of FIG. 1. The processor 710 may also control a bias to the bit line 236 and the first and second word lines 232, 240 according to the circuit 200 of FIG. 2 to provide the first and second current 131*a*, 131*b* to the source 108 and drain 110, respectively. As another example, the processor 710 may control a bias to the main word line 130 at the system programming voltage (Vp) according to the second particular embodiment of FIG. 1. The processor 710 may also control a bias to the bit line 436 and the first and second word lines 432, 440 according to the circuit 400 of FIG. 4 to provide the first and second current 131*a*, 131*b* to the source 108 and drain 110, respectively. The instructions 756 may also be executable by an alternative processor (not shown) coupled to the processor 810.

In a particular embodiment, the processor 710, the display controller 726, the memory 732, the CODEC 734, and the wireless controller 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the antenna 742, and the power supply 744 are external to the system-on-chip device 722. However, each of the display 728, the input device 730, the speaker 736, the microphone 738, the antenna 742, and the power supply 744 can be coupled to a component of the system-on-chip device 722, such as an interface or a controller.

In conjunction with the described embodiments, an apparatus includes means for creating a first breakdown condition between a source overlap region of a semiconductor transistor structure and a gate of the semiconductor transistor structure. For example, the means for creating the first breakdown condition may include the first word line 130 of FIG. 1, the first word line 230 of FIGS. 2-3, the first word line 430 of FIGS. 4-5, the access transistor 204 of FIG. 2, the bit line 236 of FIG. 2, the second word line 232 of FIG. 2, the well line 234 of FIG. 2, the access transistor 404 of FIG. 4, the bit line 436 of FIG. 4, the second word line 432 of FIG. 4, the well line 434 of FIG. 4, the processor 710 programmed to execute the instructions 756 of FIG. 7, one or more other devices, circuits, modules, or instructions to create the first breakdown condition, or any combination thereof.

The apparatus may also include means for creating a second breakdown condition between a drain overlap region of the semiconductor transistor structure and the gate. For example, the means for creating the second breakdown condition the first word line 130 of FIG. 1, the first word line 230 of FIGS. 2-3, the first word line 430 of FIGS. 4-5, the access transistor 204 of FIG. 2, the bit line 236 of FIG. 2, the second word line 232 of FIG. 2, the well line 234 of FIG. 2, the access transistor 404 of FIG. 4, the bit line 436 of FIG. 4, the second word line 432 of FIG. 4, the well line 434 of FIG. 4, the processor 710 programmed to execute the instructions 756 of FIG. 7, one or more other devices, circuits, modules, or instructions to create the second breakdown condition, or any combination thereof.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received at the manufacturing process 800, such as at a research computer 806. The physical device information 802 may include design information representing at least one physical property of a semiconductor device, such as a device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof, that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof, or any combination thereof, of the library file 812. For example, a user of the design computer 814 may enter circuit design information 822 via a user interface 824 coupled to the design computer 814.

The circuit design information 822 may include design information representing at least one physical property of a semiconductor device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing a device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof, and that also includes additional electronic circuits and components within the SOC.

The GDSII file 826 may be received at a fabrication process 828 to manufacture a semiconductor device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof, according to transformed information in the GDSII file 826. For example, a device manufacture process may include providing the GDSII file 826 to a mask manufacturer 830 to create one or more masks, such as masks to be used with photolithography processing, illustrated as a representative mask 832. The mask 832 may be used during the fabrication process to generate one or more wafers 834, which may be tested and separated into dies, such as a representative die 836. The die 836 includes a circuit including the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the a device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines to perform various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer, into which the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof is integrated. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. In addition to remote units according to teachings of the disclosure, embodiments of the disclosure may be suitably employed in any device which includes active integrated circuitry including memory and on-chip circuitry.

A device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof, may be fabricated, processed, and incorporated into an electronic device, as described in the illustrative process 800. One or more aspects of the embodiments disclosed with respect to FIGS. 1-7 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a semiconductor transistor structure including:
      a dielectric material;
      a channel region;
      a gate;
      a source overlap region that is biasable to cause a first voltage difference between the source overlap region and the gate to exceed a breakdown voltage of the dielectric material; and
      a drain overlap region that is biasable to cause a second voltage difference between the drain overlap region and the gate to exceed the breakdown voltage;
   a well line coupled to a body of the semiconductor transistor; and
   circuitry configured to apply a voltage to the well line to prevent a breakdown condition between the channel region and the gate.

2. The apparatus of claim 1, wherein the circuitry comprises:
   a first access transistor coupled to a source of the semiconductor transistor structure; and
   a second access transistor coupled to a drain of the semiconductor transistor structure.

3. The apparatus of claim 2, wherein a body of the first access transistor is coupled to the well line and a body of the second access transistor is coupled to the well line.

4. The apparatus of claim 1, wherein a first breakdown condition occurs when the first voltage difference exceeds the breakdown voltage and a second breakdown condition occurs when the second voltage difference exceeds the breakdown voltage.

5. The apparatus of claim 4, wherein the first breakdown condition corresponds to a first programmable state of the semiconductor transistor structure indicating a first logical value and the second breakdown condition corresponds to a second programmable state of the semiconductor transistor structure indicating a second logical value.

6. The apparatus of claim 5, wherein the first logical value is equal to the second logical value.

7. The apparatus of claim 5, wherein the first logical value is different from the second logical value.

8. The apparatus of claim 1, further comprising a device selected from a communication device, a computer, a set top box, a music player, a video player, an entertainment unit, a navigation device, a personal digital assistant (PDA), or a fixed location data unit, into which the semiconductor transistor structure is integrated.

9. A method comprising:
   creating a first conductivity path between a source overlap region of a semiconductor transistor structure and a gate of the semiconductor transistor structure;
   creating a second conductivity path between the gate and a drain overlap region of the semiconductor transistor structure; and
   applying a voltage to a well line coupled to a body of the semiconductor transistor structure to prevent a breakdown condition between the gate and a channel region of the semiconductor transistor structure.

10. The method of claim 9, further comprising:
    applying the voltage to a body of a first access transistor coupled to the well line by applying the voltage to the well line; and
    applying the voltage to a body of a second access transistor coupled to the well line by applying the voltage to the well line.

11. The method of claim 10, wherein creating the first conductivity path corresponds to a programming operation.

12. The method of claim 11, wherein creating the first conductivity path includes causing a first voltage difference between the source overlap region and the gate to exceed a breakdown voltage of the semiconductor transistor structure by applying a gate voltage to the gate and applying a program voltage that is less than the gate voltage to the source overlap region.

13. The method of claim 12, wherein the voltage and the gate voltage are approximately zero volts.

14. The method of claim 11, wherein creating the first conductivity path includes causing a first voltage difference between the source overlap region and the gate to exceed a dielectric breakdown voltage of the semiconductor transistor structure by applying a program voltage to the gate and applying a drain voltage to the drain overlap region.

15. The method of claim 14, wherein the drain voltage is approximately equal to a threshold voltage of the first access transistor.

16. An apparatus comprising:
    means for storing a logical state;
    means for creating a first conductivity path between a source overlap region of the means for storing the logical state and a gate of the means for storing the logical state;
    means for creating a second conductivity path between a drain overlap region of the means for storing the logical state and the gate;
    first means for accessing the means for storing the logical state; and
    means for biasing a body contact of the means for storing the logical state, wherein the means for biasing the body contact of the means for storing the logical state is coupled to a body of the first means and coupled to a body of the means for storing the logical state.

17. The apparatus of claim 16, further comprising second means for accessing the means for storing the logical state, the means for biasing the body contact coupled to a body of the second means.

18. A non-transitory computer readable medium comprising instructions that, when executed by a processor, cause the processor to:
    create a first conductivity path between a source overlap region of a semiconductor transistor structure and a gate of the semiconductor transistor structure;
    create a second conductivity path between the gate and a drain overlap region of the semiconductor transistor structure; and apply a voltage to a well line coupled to a body of the semiconductor transistor structure to prevent a breakdown condition between the gate and a channel region of the semiconductor transistor structure.

19. The non-transitory computer readable medium of claim 18, further comprising instructions that, when executed by the processor, cause the processor to perform a reading operation at the semiconductor transistor structure after creation of the first conductivity path.

20. The non-transitory computer readable medium of claim 18, further comprising instructions that, when executed by the processor, cause the processor to:

apply the voltage to a body of a first access transistor coupled to the well line by applying the voltage to the well line; and apply the voltage to a body of a second access transistor coupled to the well line by applying the voltage to the well line.

* * * * *